US011682024B2

(12) United States Patent
Von Teichman et al.

(10) Patent No.: US 11,682,024 B2
(45) Date of Patent: Jun. 20, 2023

(54) DYNAMIC CONTACT MANAGEMENT SYSTEMS AND METHODS

(71) Applicant: LEADASSIGN CORPORATION, Toronto (CA)

(72) Inventors: Desmond Von Teichman, Thornbury (CA); Thomas Andersen, Meaford (CA); James Palmer, Meaford (CA)

(73) Assignee: LeadAssign Corporation, Toronto (CA)

( * ) Notice: Subject to any disclaimer, the term of this patent is extended or adjusted under 35 U.S.C. 154(b) by 0 days.

(21) Appl. No.: 17/659,366

(22) Filed: Apr. 15, 2022

(65) Prior Publication Data

US 2022/0245646 A1 Aug. 4, 2022

Related U.S. Application Data

(63) Continuation of application No. 15/929,275, filed on Apr. 21, 2020, now Pat. No. 11,308,501, which is a continuation of application No. 14/951,905, filed on Nov. 25, 2015, now Pat. No. 10,628,830.

(60) Provisional application No. 62/083,942, filed on Nov. 25, 2014.

(51) Int. Cl.
*G06F 16/00* (2019.01)
*G06Q 30/01* (2023.01)
*G06F 16/245* (2019.01)
*G06F 16/28* (2019.01)
*G06F 16/93* (2019.01)
*G06F 16/27* (2019.01)

(52) U.S. Cl.
CPC .......... *G06Q 30/01* (2013.01); *G06F 16/245* (2019.01); *G06F 16/27* (2019.01); *G06F 16/285* (2019.01); *G06F 16/93* (2019.01)

(58) Field of Classification Search
CPC .................................................... G06F 16/27
See application file for complete search history.

(56) References Cited

U.S. PATENT DOCUMENTS

2002/0133392 A1  9/2002  Angel et al.
2010/0010968 A1  1/2010  Redlich et al.

*Primary Examiner* — Ajith Jacob
(74) *Attorney, Agent, or Firm* — Rosenberg, Klein & Lee

(57) ABSTRACT

For micro, small and medium enterprises issues relating to cost, manpower, IT infrastructure, etc. absorb a major portion of the enterprise's focus. However, today they are also marketing and engaging their customers and potential customers on more parallel channels than ever today across traditional media, electronic media and evolving trends such as social media, blogs, etc. Accordingly, micro, small and medium enterprises would benefit from a solution implementing lead management across these wide range of technologies and formats at a time where network capabilities and portable electronic device capabilities have led to expectations, especially within younger demographics such as "millennials" particularly, of immediate responsiveness.

20 Claims, 9 Drawing Sheets

DYNAMIC CONTACT MANAGEMENT SYSTEMS AND METHODS

CROSS-REFERENCE TO RELATED APPLICATIONS

This patent application claims the benefit of priority as a continuation of U.S. patent application Ser. No. 15/929,275 filed Apr. 21, 2020; which itself claims the benefit of priority from U.S. patent application Ser. No. 14/951,905 filed Nov. 25, 2015, now issued as U.S. Pat. No. 10,628,830; which itself claims the benefit of priority from U.S. Provisional Patent Application 62/083,942 filed Nov. 25, 2014; the entire contents of each being incorporated herein by reference.

FIELD OF THE INVENTION

This invention relates to sales contacts and more particularly to integrated front-end contact and lead management systems supporting diverse entry formats and distributed impacted personnel.

BACKGROUND OF THE INVENTION

Within business the term "Lead Management" typically refers to the methodologies, systems, and practices employed by a business to generate new potential business and business clientele, and is generally operated through a variety of marketing campaigns or programs. Lead management as commonly thought of facilitates the connection between outgoing consumer—customer advertising and the responses to that advertising. As such different processes may be employed business-to-business and direct-to-consumer activities. Lead management is considered therefore a precursor to sales management (SM) and customer relationship management (CRM). As such within the prior art this has been viewed as the connectivity that facilitates business profitability through the acquisition of new customers, selling to existing customers, and creating a market brand.

As such within the prior art the general principles of lead management create an ordered structure for managing volumes of business inquiries, frequently termed leads. The processes are therefore established to create an architecture for the organization of data, distributed across the various stages of a sales process, and across a distributed sales force. With the advent of the Internet and other information systems technologies, this process has rapidly become technology-centric, as businesses practicing lead management techniques have shifted to automated systems. However, a reliance on automation can significantly minimize the personal interactions with lead inquiries that are vital to success within a significant proportion of enterprises, especially at the micro, small and medium enterprise (MSME) levels. The European Community defines MSMEs as being enterprises with up to 10, 50 and 250 employees respectively.

Accordingly, today lead management systems, whilst apparently simple in scope, have evolved to model and simulate complex process flows as clients, prospective clients, and enterprise personnel, typically sales professionals, interact. These prior art approaches are complex as each interaction and subsequent action creates a variety of potential outcomes, both productive and counter-productive to business development. This ever-increasing number of scenarios creates functional disconnects, in other words, critical opportunities to mishandle an inquiry that reduces or destroys its potential value. Appropriate management of these scenarios is the function of lead management within the prior art.

However, for MSMEs, lead management is typically not part of an overall set of business solutions including SM, CRM, etc. although even at their initial stages MSMEs know such tools and methodologies are available. Rather MSMEs experience issues relating to cost, manpower, IT infrastructure, etc. and hence such tool sets are typically in their future plans. However, at the same time MSMEs today are marketing and engaging their customers and potential customers on more parallel channels than ever as today as leads etc. may arise from traditional telephony, although may be fixed and mobile which may trigger different response approaches, and in-person but also via electronic mail (email), form completion upon web site(s), website tracking software, and social media which may itself represent posts to social media, social media content, etc. as well as text. This increased range of options also comes at a time where both network capabilities and portable electronic device capabilities have led to expectations, within younger demographics particularly, of immediate responsiveness.

Accordingly, it would be beneficial to provide MSMEs with a discrete user configurable software solution allowing them to receive customer input from a disparate array of sources and based upon tags and content within the customer input route the input to one or more MSME personnel.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to address limitations within the prior art relating sales contacts and more particularly to integrated front-end contact and lead management systems supporting diverse entry formats and distributed impacted personnel.

In accordance with an embodiment of the invention there is provided a method of automatically receiving and distributing a related set of data within an enterprise wherein each related set of data is received from a source of a plurality of sources and comprises at least a tag of a plurality of tags such that the distribution is based upon at least the plurality of tags, a plurality of first rules each associated with a specific tag type and/or tag value, and a plurality of second rules established by the enterprise each relating to a portion of the internal organization and personnel of the enterprise.

In accordance with an embodiment of the invention there are provided computer implementable instructions stored within a non-volatile, non-transitory physical storage medium for execution by a microprocessor, the computer implementable instructions relating to a process, the process comprising automatically receiving and distributing a related set of data within an enterprise wherein each related set of data is received from a source of a plurality of sources and comprises at least a tag of a plurality of tags such that the distribution is based upon at least the plurality of tags, a plurality of first rules each associated with a specific tag type and/or tag value, and a plurality of second rules established by the enterprise each relating to a portion of the internal organization and personnel of the enterprise.

In accordance with an embodiment of the invention there is provided a system comprising:
a microprocessor;
a first non-volatile, non-transitory physical storage medium for storing computer implementable instructions for execution by the microprocessor;
a second non-transitory physical storage medium for storing electronic content;
a plurality of first interfaces, each first interface for receiving related sets of data from a source wherein the multiple sources are different and their data is parsed by the respective first interface to associate at least a tag of a plurality of tags with the related set of data;
a plurality of second interfaces, each second interfacing for distributing to a predetermined subset of recipients of a plurality of recipients, wherein
the predetermined subset are determined based upon at least the tag of the plurality of tags and a first rule of a plurality of first rules where the first rule of the plurality of first rules is determined by at least one of the source and the first interface receiving the related set of data.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Figure 1:
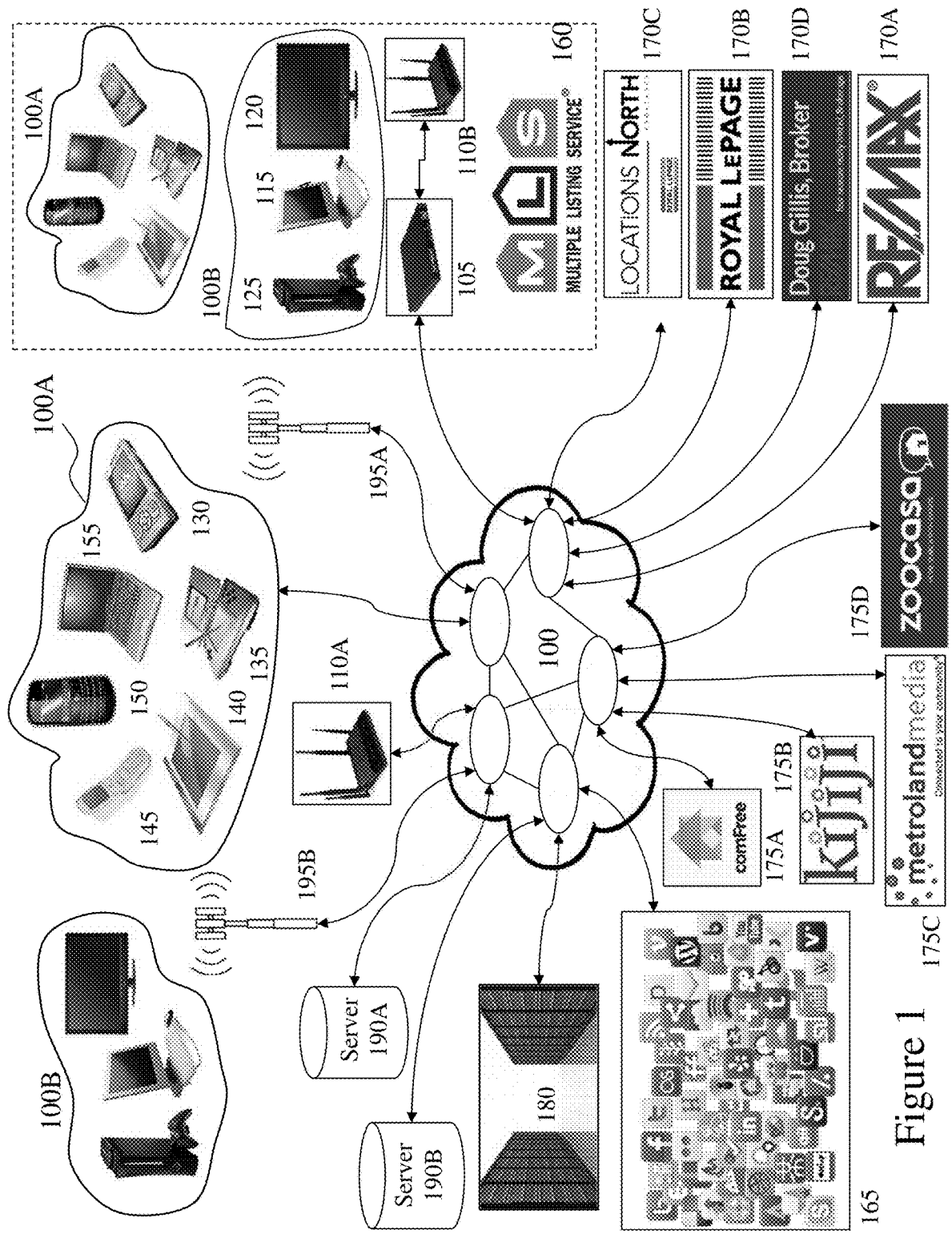
FIG. 1 depicts a network environment within which embodiments of the invention may be employed.

The present invention is directed to sales contacts and more particularly to integrated front-end contact and lead management systems supporting diverse entry formats and distributed impacted personnel.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

A "portable electronic device" (PED) as used herein and throughout this disclosure, refers to a wireless device used for communications and other applications that requires a battery or other independent form of energy for power. This includes devices, but is not limited to, such as a cellular telephone, smartphone, personal digital assistant (PDA), portable computer, pager, portable multimedia player, portable gaming console, laptop computer, tablet computer, and an electronic reader.

A "fixed electronic device" (FED) as used herein and throughout this disclosure, refers to a wireless and/or wired device used for communications and other applications that requires connection to a fixed interface to obtain power. This includes, but is not limited to, a laptop computer, a personal computer, a computer server, a kiosk, a gaming console, a digital set-top box, an analog set-top box, an Internet enabled appliance, an Internet enabled television, and a multimedia player.

An "application" (commonly referred to as an "app") as used herein may refer to, but is not limited to, a "software application", an element of a "software suite", a computer program designed to allow an individual to perform an activity, a computer program designed to allow an electronic device to perform an activity, and a computer program designed to communicate with local and/or remote electronic devices. An application thus differs from an operating system (which runs a computer), a utility (which performs maintenance or general-purpose chores), and a programming tools (with which computer programs are created). Generally, within the following description with respect to embodiments of the invention an application is generally presented in respect of software permanently and/or temporarily installed upon a PED and/or FED.

A "social network" or "social networking service" as used herein may refer to, but is not limited to, a platform to build social networks or social relations among people who may, for example, share interests, activities, backgrounds, or real-life connections. This includes, but is not limited to, social networks such as U.S. based services such as Facebook, Google+, Tumblr and Twitter; as well as Nexopia, Badoo, Bebo, VKontakte, Delphi, Hi5, Hyves, iWiW, Nasza-Klasa, Soup, Glocals, Skyrock, The Sphere, StudiVZ, Tagged, Tuenti, XING, Orkut, Mxit, Cyworld, Mixi, renren, weibo and Wretch.

"Social media" or "social media services" as used herein may refer to, but is not limited to, a means of interaction among people in which they create, share, and/or exchange information and ideas in virtual communities and networks. This includes, but is not limited to, social media services relating to magazines, Internet forums, weblogs, social blogs, microblogging, wikis, social networks, podcasts, photographs or pictures, video, rating and social bookmarking as well as those exploiting blogging, picture-sharing, video logs, wall-posting, music-sharing, crowdsourcing and voice over IP, to name a few. Social media services may be classified, for example, as collaborative projects (for example, Wikipedia); blogs and microblogs (for example, Twitter™); content communities (for example, YouTube and DailyMotion); social networking sites (for example, Facebook™); virtual game-worlds (e.g., World of Warcraft™); and virtual social worlds (e.g. Second Life™).

An "enterprise" as used herein may refer to, but is not limited to, a provider of a service and/or a product to a user, customer, or consumer. This includes, but is not limited to, a retail outlet, a store, a market, an online marketplace, a manufacturer, an online retailer, a charity, a utility, and a service provider. Such enterprises may be directly owned and controlled by a company or may be owned and operated by a franchisee under the direction and management of a franchiser.

A "service provider" as used herein may refer to, but is not limited to, a third party provider of a service and/or a product to an enterprise and/or individual and/or group of individuals and/or a device comprising a microprocessor. This includes, but is not limited to, a retail outlet, a store, a market, an online marketplace, a manufacturer, an online retailer, a utility, an own brand provider, and a service provider wherein the service and/or product is at least one of marketed, sold, offered, and distributed by the enterprise solely or in addition to the service provider.

A 'third party' or "third party provider" as used herein may refer to, but is not limited to, a so-called "arm's length" provider of a service and/or a product to an enterprise and/or individual and/or group of individuals and/or a device comprising a microprocessor wherein the consumer and/or customer engages the third party but the actual service and/or product that they are interested in and/or purchase and/or receive is provided through an enterprise and/or service provider.

A "user" as used herein may refer to, but is not limited to, an individual or group of individuals whose biometric data may be, but not limited to, monitored, acquired, stored, transmitted, processed and analysed either locally or remotely to the user wherein by their engagement with a service provider, third party provider, enterprise, social network, social media etc. via a dashboard, web service, website, software plug-in, software application, graphical user interface acquires, for example, electronic content. This includes, but is not limited to, private individuals, employees of organizations and/or enterprises, members of community organizations, members of charity organizations, men, women, children, and teenagers.

A "wearable device" or "wearable sensor" relates to miniature electronic devices that are worn by the user including those under, within, with or on top of clothing and are part of a broader general class of wearable technology which includes "wearable computers" which in contrast are directed to general or special purpose information technologies and media development. Such wearable devices and/or wearable sensors may include, but not be limited to, smartphones, smart watches, e-textiles, smart shirts, activity trackers, smart glasses, environmental sensors, medical sensors, biological sensors, physiological sensors, chemical sensors, ambient environment sensors, position sensors, neurological sensors, drug delivery systems, medical testing and diagnosis devices, and motion sensors.

"Electronic content" (also referred to as "content" or "digital content") as used herein may refer to, but is not limited to, any type of content that exists in the form of digital data as stored, transmitted, received and/or converted wherein one or more of these steps may be analog although generally these steps will be digital. Forms of digital content include, but are not limited to, information that is digitally broadcast, streamed or contained in discrete files. Viewed narrowly, types of digital content include popular media types such as MP3, JPG, AVI, TIFF, AAC, TXT, RTF, HTML, XHTML, PDF, XLS, SVG, WMA, MP4, FLV, and PPT, for example, as well as others, see for example http://en.wikipedia.org/wiki/List_of_file_formats. Within a broader approach digital content mat include any type of digital information, e.g. digitally updated weather forecast, a GPS map, an eBook, a photograph, a video, a Vine™, a blog posting, a Facebook™ posting, a Twitter™ tweet, online TV, etc. The digital content may be any digital data that is at least one of generated, selected, created, modified, and transmitted in response to a user request, said request may be a query, a search, a trigger, an alarm, and a message for example.

Reference to "content information" as used herein may refer to, but is not limited to, any combination of content features, content serving constraints, information derivable from content features or content serving constraints (referred to as "content derived information"), and/or information related to the content (referred to as "content related information"), as well as an extension of such information (e.g., information derived from content related information).

Reference to a "document" as used herein may refer to, but is not limited to, any machine-readable and machine-storable work product. A document may be a file, a combination of files, one or more files with embedded links to other files, etc. The files may be of any type, such as text, audio, image, video, etc. Parts of a document to be rendered to an end user can be thought of as "content" of the document. A document may include "structured data" containing both content (words, pictures, etc.) and some indication of the meaning of that content (for example, e-mail fields and associated data, HTML tags and associated data, etc.). In the context of the Internet, a common document is a Web page. Web pages often include content and may include embedded information (such as meta-information, hyperlinks, etc.) and/or embedded instructions (such as Javascript, etc.). In many cases, a document has a unique, addressable, storage location and can therefore be uniquely identified by this addressable location such as a universal resource locator (URL) for example used as a unique address used to access information on the Internet.

"Document information" as used herein may refer to, but is not limited to, may include any information included in the document, information derivable from information included in the document (referred to as "document derived information"), and/or information related to the document (referred to as "document related information"), as well as an extensions of such information (e.g., information derived from related information). An example of document derived information is a classification based on textual content of a document. Examples of document related information include document information from other documents with links to the instant document, as well as document information from other documents to which the instant document links.

Referring to FIG. 1 there is depicted a network environment 100 within which embodiments of the invention may be employed supporting publishing systems and publishing applications/platforms (CMS-CMAPs) according to embodiments of the invention. Such CMS-CMAPs, for example supporting multiple channels and dynamic content. As shown first and second user groups 100A and 100B respectively interface to a telecommunications network 100. Within the representative telecommunication architecture a remote central exchange 180 communicates with the remainder of a telecommunication service providers network via the network 100 which may include for example long-haul OC-48/OC-192 backbone elements, an OC-48 wide area network (WAN), a Passive Optical Network, and a Wireless Link. The central exchange 180 is connected via the network 100 to local, regional, and international exchanges (not shown for clarity) and therein through network 100 to first and second cellular APs 195A and 195B respectively which provide Wi-Fi cells for first and second user groups 100A and 100B respectively. Also connected to the network 100 are first and second Wi-Fi nodes 110A and 110B, the latter of which being coupled to network 100 via router 105. Second Wi-Fi node 110B is associated with Enterprise 160, e.g. Multiple Listing Service™, comprising other first and second user groups 100A and 100B. Second user group 100B may also be connected to the network 100 via wired interfaces including, but not limited to, DSL, Dial-Up, DOCSIS, Ethernet, G.hn, ISDN, MoCA, PON, and Power line communication (PLC) which may or may not be routed through a router such as router 105.

Within the cell associated with first AP 110A the first group of users 100A may employ a variety of PEDs including for example, laptop computer 155, portable gaming console 135, tablet computer 140, smartphone 150, cellular telephone 145 as well as portable multimedia player 130. Within the cell associated with second AP 110B are the second group of users 100B which may employ a variety of FEDs including for example gaming console 125, personal computer 115 and wireless/Internet enabled television 120 as well as cable modem 105. First and second cellular APs 195A and 195B respectively provide, for example, cellular GSM (Global System for Mobile Communications) telephony services as well as 3G and 4G evolved services with enhanced data transport support. Second cellular AP 195B provides coverage in the exemplary embodiment to first and second user groups 100A and 100B. Alternatively the first and second user groups 100A and 100B may be geographically disparate and access the network 100 through multiple APs, not shown for clarity, distributed geographically by the network operator or operators. First cellular AP 195A as show provides coverage to first user group 100A and environment 170, which comprises second user group 100B as well as first user group 100A. Accordingly, the first and second user groups 100A and 100B may according to their particular communications interfaces communicate to the network 100 through one or more wireless communications standards such as, for example, IEEE 802.11, IEEE 802.15, IEEE 802.16, IEEE 802.20, UMTS, GSM 850, GSM 900, GSM 1800, GSM 1900, GPRS, ITU-R 5.138, ITU-R 5.150, ITU-R 5.280, and IMT-1000. It would be evident to one skilled in the art that many portable and fixed electronic devices may support multiple wireless protocols simultaneously, such that for example a user may employ GSM services such as telephony and SMS and Wi-Fi/WiMAX data transmission, VOIP and Internet access. Accordingly portable electronic devices within first user group 100A may form associations either through standards such as IEEE 802.15 and Bluetooth as well in an ad-hoc manner.

Also connected to the network 100 are Social Networks (SOCNETS) 165, first and second service provider networks 170A and 170B respectively, e.g. RE/MAX™ and Royal LePage™ first and second service providers 170C and 170D respectively, e.g. Locations North and Doug Gillis, parts of the second and first service provider networks 170B and 170A respectively. Also connected to the network 100 are first to fourth feed networks 175A to 175D respectively, e.g. comFree™, Kijiji™, MetrolandMedia, and Zoocasa™ together with others, not shown for clarity. First and second servers 190A and 190B may host according to embodiments of the inventions multiple services associated with a provider of contact management systems and contact management applications/platforms (CMS-CMAPs); a provider of a SOCNET or Social Media (SOME) exploiting CMS-CMAP features; a provider of a SOCNET and/or SOME not exploiting CMS-CMAP features; a provider of services to PEDS and/or FEDS; a provider of one or more aspects of wired and/or wireless communications; an Enterprise 160 exploiting CMS-CMAP features; license databases; content databases; image databases; content libraries; customer databases; websites; and software applications for download to or access by FEDs and/or PEDs exploiting and/or hosting CMS-CMAP features. First and second primary content servers 190A and 190B may also host for example other Internet services such as a search engine, financial services, third party applications and other Internet based services.

Accordingly, a consumer and/or customer (CONCUS) may exploit a PED and/or FED within an Enterprise 160, for example, and access one of the first or second primary content servers 190A and 190B respectively to perform an operation such as accessing/downloading an application which provides CMS-CMAP features according to embodiments of the invention; execute an application already installed providing CMS-CMAP features; execute a web based application providing CMS-CMAP features; or access content. Similarly, a CONCUS may undertake such actions or others exploiting embodiments of the invention exploiting a PED or FED within first and second user groups 100A and 100B respectively via one of first and second cellular APs 195A and 195B respectively and first Wi-Fi nodes 110A.

Figure 2:
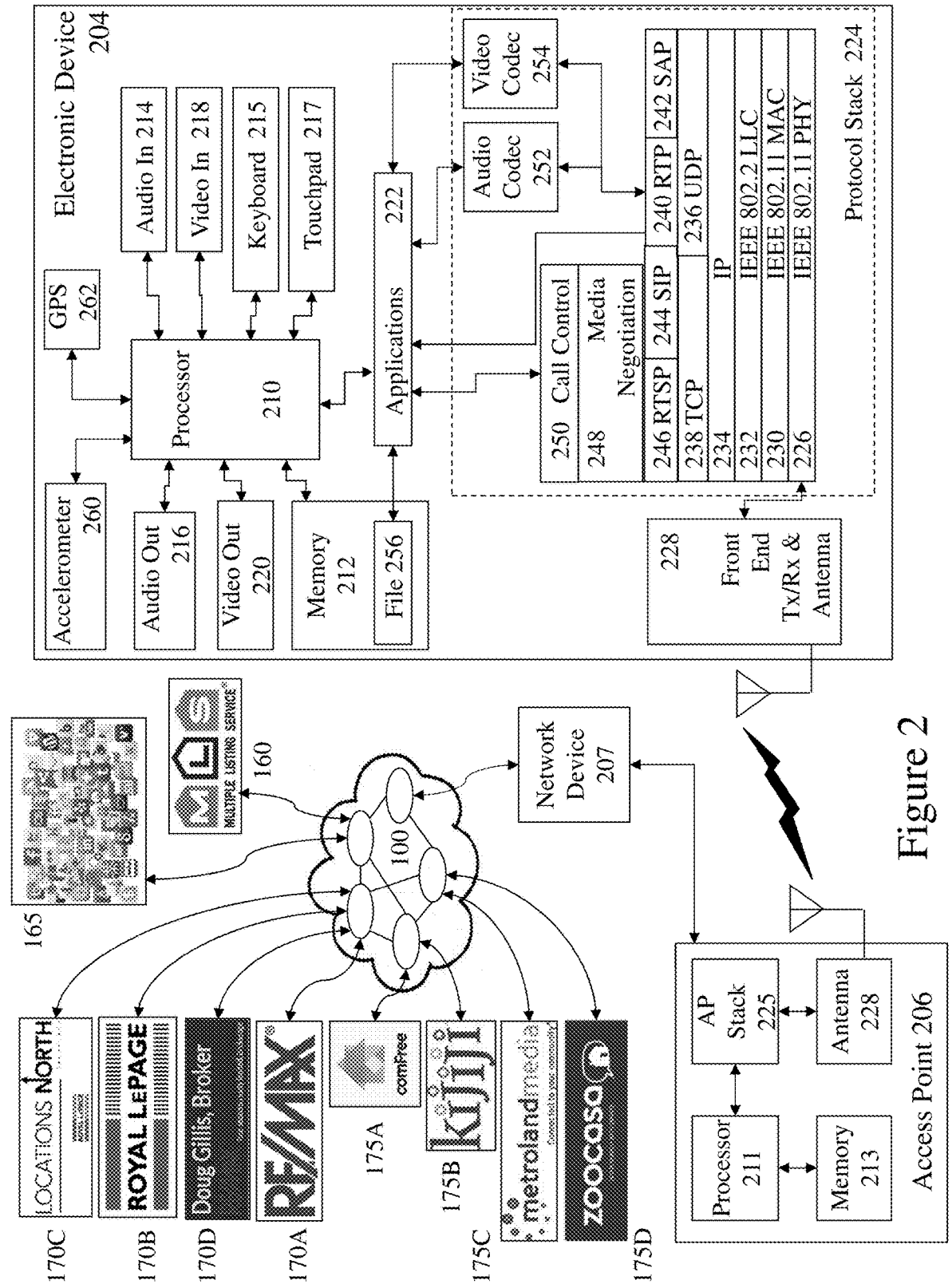
FIG. 2 depicts a wireless portable electronic device supporting communications to a network such as depicted in FIG. 1 and as supporting embodiments of the invention.

Now referring to FIG. 2 there is depicted an electronic device 204 and network access point 207 supporting CMS-CMAP features according to embodiments of the invention. Electronic device 204 may, for example, be a PED and/or FED and may include additional elements above and beyond those described and depicted. Also depicted within the electronic device 204 is the protocol architecture as part of a simplified functional diagram of a system 200 that includes an electronic device 204, such as a smartphone 155, an access point (AP) 206, such as first AP 110, and one or more network devices 207, such as communication servers, streaming media servers, and routers for example such as first and second servers 190A and 190B respectively. Network devices 207 may be coupled to AP 206 via any combination of networks, wired, wireless and/or optical communication links such as discussed above in respect of FIG. 1 as well as directly as indicated. Network devices 207 are coupled to network 100 and therein Social Networks (SOCNETS) 165, first and second service provider networks 170A and 170B respectively, e.g. RE/MAX™ and Royal LePage™, first and second service providers 170C and 170D respectively, e.g. Locations North and Doug Gillis, parts of the first and second service provider networks 170A and 170B respectively and first to fourth feed networks 175A to 175D respectively, e.g. comFree™, Kijiji™, MetrolandMedia, and Zoocasa™ together with others, not shown for clarity.

The electronic device 204 includes one or more processors 210 and a memory 212 coupled to processor(s) 210. AP 206 also includes one or more processors 211 and a memory 213 coupled to processor(s) 210. A non-exhaustive list of examples for any of processors 210 and 211 includes a central processing unit (CPU), a digital signal processor (DSP), a reduced instruction set computer (RISC), a complex instruction set computer (CISC) and the like. Furthermore, any of processors 210 and 211 may be part of application specific integrated circuits (ASICs) or may be a part of application specific standard products (ASSPs). A non-exhaustive list of examples for memories 212 and 213 includes any combination of the following semiconductor devices such as registers, latches, ROM, EEPROM, flash memory devices, non-volatile random access memory devices (NVRAM), SDRAM, DRAM, double data rate (DDR) memory devices, SRAM, universal serial bus (USB) removable memory, and the like.

Electronic device 204 may include an audio input element 214, for example a microphone, and an audio output element 216, for example, a speaker, coupled to any of processors 210. Electronic device 204 may include a video input element 218, for example, a video camera or camera, and a video output element 220, for example an LCD display, coupled to any of processors 210. Electronic device 204 also includes a keyboard 215 and touchpad 217 which may for example be a physical keyboard and touchpad allowing the user to enter content or select functions within one of more applications 222. Alternatively the keyboard 215 and touchpad 217 may be predetermined regions of a touch sensitive element forming part of the display within the electronic device 204. The one or more applications 222 that are typically stored in memory 212 and are executable by any combination of processors 210. Electronic device 204 also includes accelerometer 260 providing three-dimensional motion input to the process 210 and GPS 262 which provides geographical location information to processor 210.

Electronic device 204 includes a protocol stack 224 and AP 206 includes a communication stack 225. Within system 200 protocol stack 224 is shown as IEEE 802.11 protocol stack but alternatively may exploit other protocol stacks such as an Internet Engineering Task Force (IETF) multimedia protocol stack for example. Likewise AP stack 225 exploits a protocol stack but is not expanded for clarity. Elements of protocol stack 224 and AP stack 225 may be implemented in any combination of software, firmware and/or hardware. Protocol stack 224 includes an IEEE 802.11-compatible PHY module 226 that is coupled to one or more Front-End Tx/Rx & Antenna 228, an IEEE 802.11-compatible MAC module 230 coupled to an IEEE 802.2-compatible LLC module 232. Protocol stack 224 includes a network layer IP module 234, a transport layer User Datagram Protocol (UDP) module 236 and a transport layer Transmission Control Protocol (TCP) module 238.

Protocol stack 224 also includes a session layer Real Time Transport Protocol (RTP) module 240, a Session Announcement Protocol (SAP) module 242, a Session Initiation Protocol (SIP) module 244 and a Real Time Streaming Protocol (RTSP) module 246. Protocol stack 224 includes a presentation layer media negotiation module 248, a call control module 250, one or more audio codecs 252 and one or more video codecs 254. Applications 222 may be able to create maintain and/or terminate communication sessions with any of devices 207 by way of AP 206. Typically, applications 222 may activate any of the SAP, SIP, RTSP, media negotiation and call control modules for that purpose. Typically, information may propagate from the SAP, SIP, RTSP, media negotiation and call control modules to PHY module 226 through TCP module 238, IP module 234, LLC module 232 and MAC module 230.

It would be apparent to one skilled in the art that elements of the electronic device 204 may also be implemented within the AP 206 including but not limited to one or more elements of the protocol stack 224, including for example an IEEE 802.11-compatible PHY module, an IEEE 802.11-compatible MAC module, and an IEEE 802.2-compatible LLC module 232. The AP 206 may additionally include a network layer IP module, a transport layer User Datagram Protocol (UDP) module and a transport layer Transmission Control Protocol (TCP) module as well as a session layer Real Time Transport Protocol (RTP) module, a Session Announcement Protocol (SAP) module, a Session Initiation Protocol (SIP) module and a Real Time Streaming Protocol (RTSP) module, media negotiation module, and a call control module. Portable and fixed electronic devices represented by electronic device 204 may include one or more additional wireless or wired interfaces in addition to the depicted IEEE 802.11 interface which may be selected from the group comprising IEEE 802.15, IEEE 802.16, IEEE 802.20, UMTS, GSM 850, GSM 900, GSM 1800, GSM 1900, GPRS, ITU-R 5.138, ITU-R 5.150, ITU-R 5.280, IMT-1000, DSL, Dial-Up, DOCSIS, Ethernet, G.hn, ISDN, MoCA, PON, and Power line communication (PLC).

Figure 3:
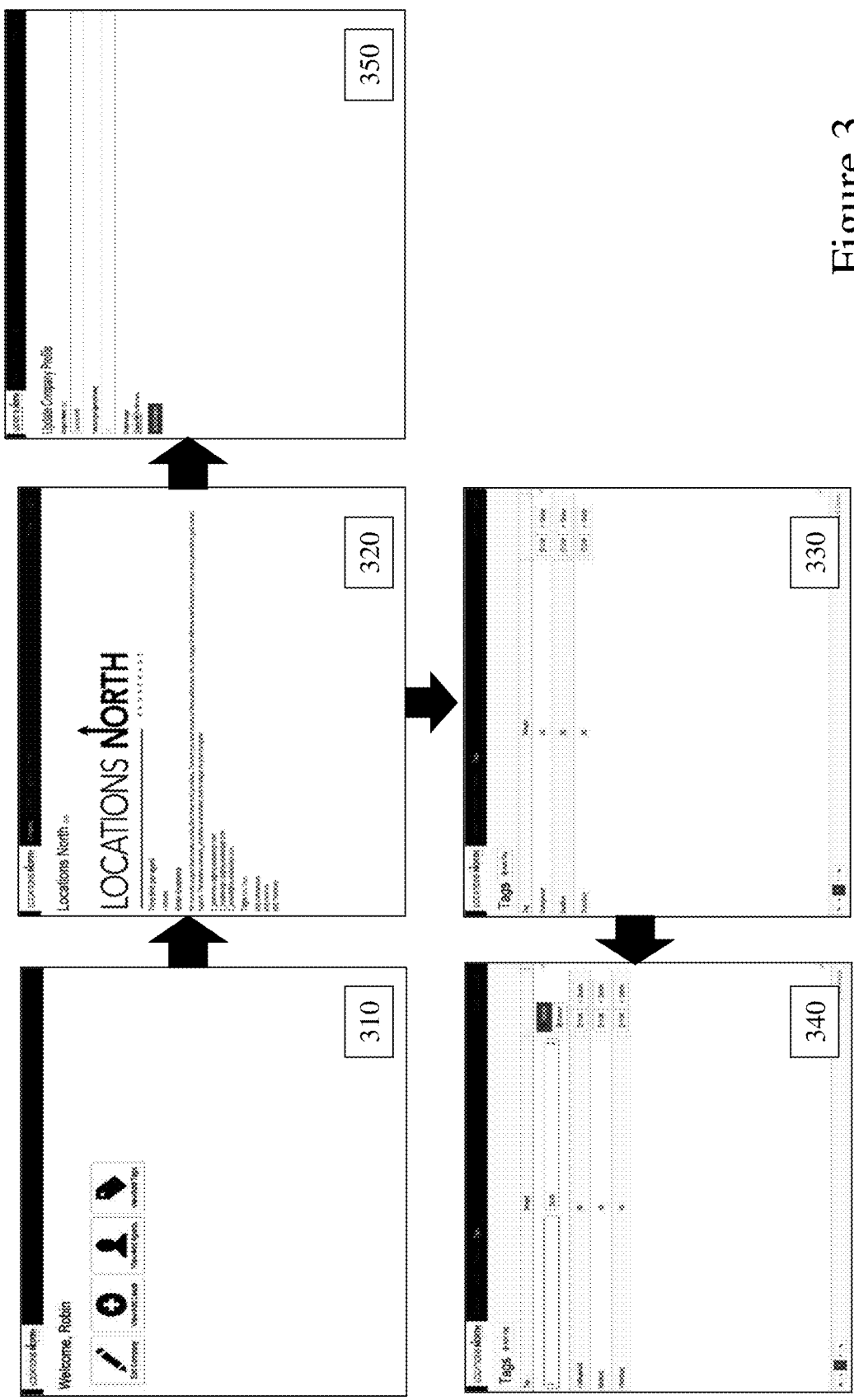
FIG. 3 depicts exemplary screenshots of an application according to an embodiment of the invention relating to a real estate brokerage.

Now referring to FIG. 3 there are depicted first to fifth exemplary screenshots 310 to 350 respectively of an application according to an embodiment of the invention relating to a real estate brokerage exploiting a CMS-CMAP. Within first screenshot 310 a user, Robin, has logged into the CMS-CMAP which due to their login credentials has directed them to Locations North, i.e. first service provider 170C, wherein they are provided with links to edit their company details, view/add leads, view/add agents, and view/add tags. Other users may be provided with a more restricted set of options, e.g. view/add leads and view/add tags. The user if they select company details is directed to second screenshot 320 which displays company logo, a time limit per agent, e.g. 5 minutes; lists email endpoints, e.g. 2_gethomes.ca@mg.leadassign.com; 2_royallepage@mg.leadassign.com; 2_default@mg.leadassign.com; and tags associated with the service provider, e.g. Collingwood, Meaford, and Thornbury.

On second screenshot 320 the user has an "Edit" button which directs the user to fifth screenshot 350 allowing the user to change company details such as displayed company name, time limit per agent, and company logo. The time limit per agent represents the time that an agent, e.g. sales agent, has to respond to a request from a CONCUS routed to them before it is passed to another agent to address. Such a time limit may be applied, for example, to queries received through one or more SOCNETs, e.g. Twitter™ or Facebook™. Within other embodiments of the invention multiple time limits may be applied, i.e. according to the SOCNET for example. Within other embodiments of the invention keyword filters, tag identifiers such as hashtags for example, etc. may be established and applied by the user in respect of the timings such that responsiveness may be tailored to their business, service, CONCUS enquiry etc. For example, a Facebook posting from a CONCUS containing the hashtag viewing may trigger a short time limit per agent such that the CMS-CMAP will cycle through agents quickly in the event that no response is received to address the CONCUS enquiry in a timely manner. As evident from discussions below in respect of embodiments of the invention below the agent or agents may be contacted through one or more means based upon factors such as the enquiry, the enquiry source, hashtag(s), etc. Accordingly, the CMS-CMAP may send a message to an agent by one or more means simultaneously, e.g. electronic mail, tweet, Facebook post, telephone, and text. Optionally, the CMS-CMAP may cycle agents using one subset of messaging formats before cycling a second time using a different subset of messaging formats. For example, initially a text message may be employed followed by a telephone call.

If in second screenshot 320 the user elects to edit the tags then they are presented initially with third screenshot 330 wherein each currently established tag is listed together with associated edit and delete buttons. Selection of edit leads the user to fourth screenshot 340 allowing them to adjust the tag either in term or its weighting. The user may also through third screenshot 330 add new tags. Accordingly, weightings may be assigned to tags for process determination and actions by the CMS-CMAP. Optionally, the user may be also provided through tag edit/addition screens, not depicted for clarity, to associate particular agent groups, agents, actions, events etc. based upon combinations of tags and/or their weightings.

Figure 4:
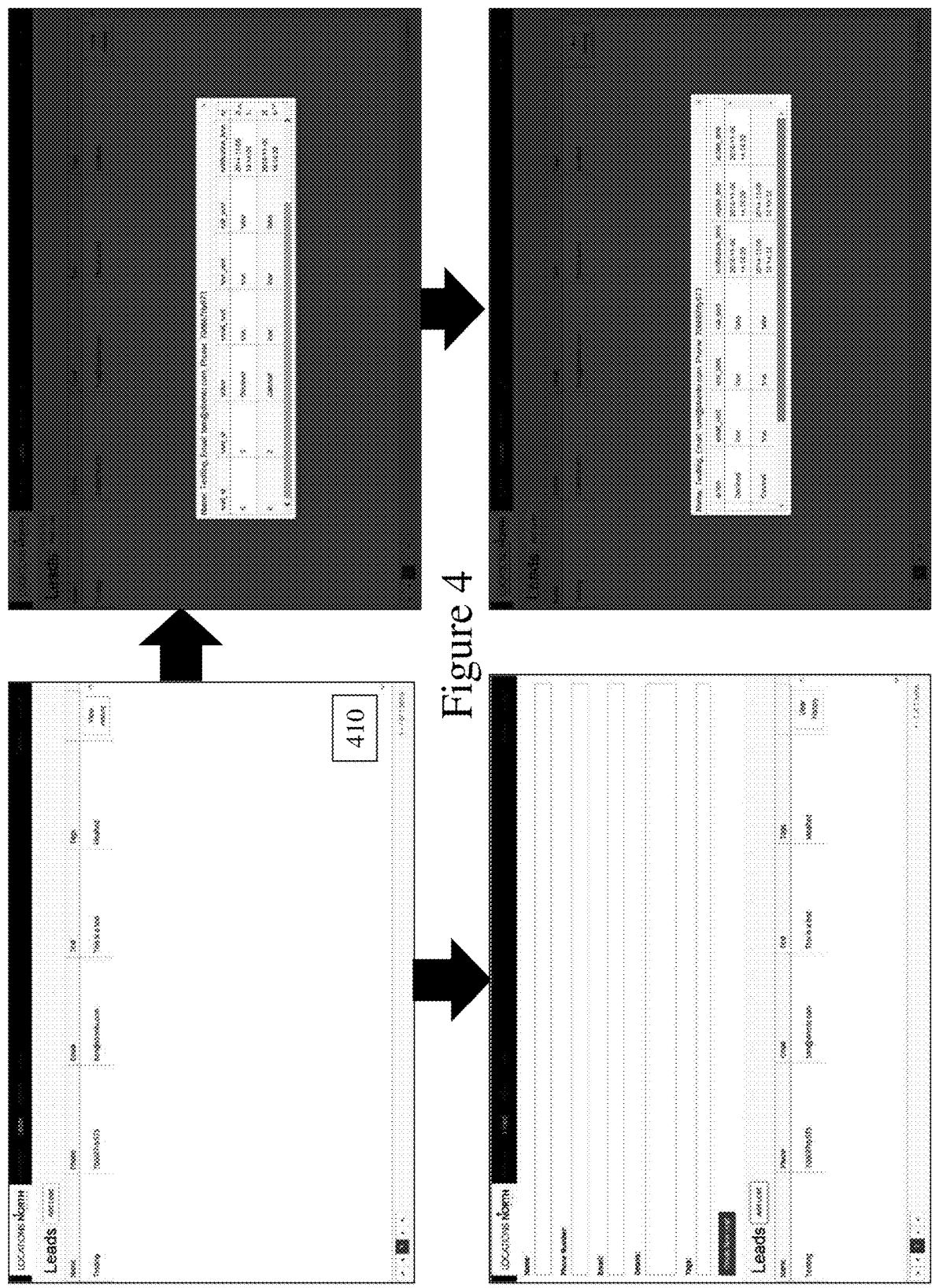
FIG. 4 depicts exemplary screenshots of an application according to an embodiment of the invention relating to a real estate brokerage.

Now referring to FIG. 4 there are depicted first to third screenshots 410 to 430 respectively of an application according to an embodiment of the invention relating to a real estate brokerage exploiting a CMS-CMAP. In first screenshot 310 in FIG. 3 if the user elects to view/add leads then they are initially directed to first screen shot 410 in FIG. 4. Accordingly, displayed to the user are current leads with key extracted data such as name, phone, email, text, tags allowing them to view these, sort, filter, etc. as known within the prior art. The user can also view any event history of the lead generated as the result of actions by the CMS-CMAP. Such event history may include, but not be limited to, receipt timing, action timing, action results, agent(s) engaged, etc. Within first screenshot 410 the user is able to manually add a lead to the CMS-CMAP although such leads as described below in respect of FIGS. 8 to 10 will also be acquired through processing of one or more lead sources and referral means which in many instances will be automatically processed and entered into the CMS-CMAP.

If the user selects to view the lead history then they are presented with a pop-up window, for example, such as depicted in second and third screenshot 420 and 430 respectively, wherein the history is shown. In this instance it shows that on 2014 Nov. 6 at 14:14:32 the agent with user_id=3 declined the sales lead that had been initiated at 14:14:09 with a 5 minute time limit set to expire at 14:19:08. As the agent declined the process then shows that at 14:14:32 the task was action to user_id=2, similarly by email and text, with a new expiry time now of 14:19:32 but the status of "Catchall" indicates the agent with user_id=2 had been contact regarding handling the lead. If the user instead elected in first screenshot 410 to add a new lead they would be presented with fourth screen shot 440 wherein the user is prompted to enter key information such as contact name, telephone number, email address, leads details and any tags. Once created the process triggers notifications and agent sequencing such as described above and below.

Figure 5:
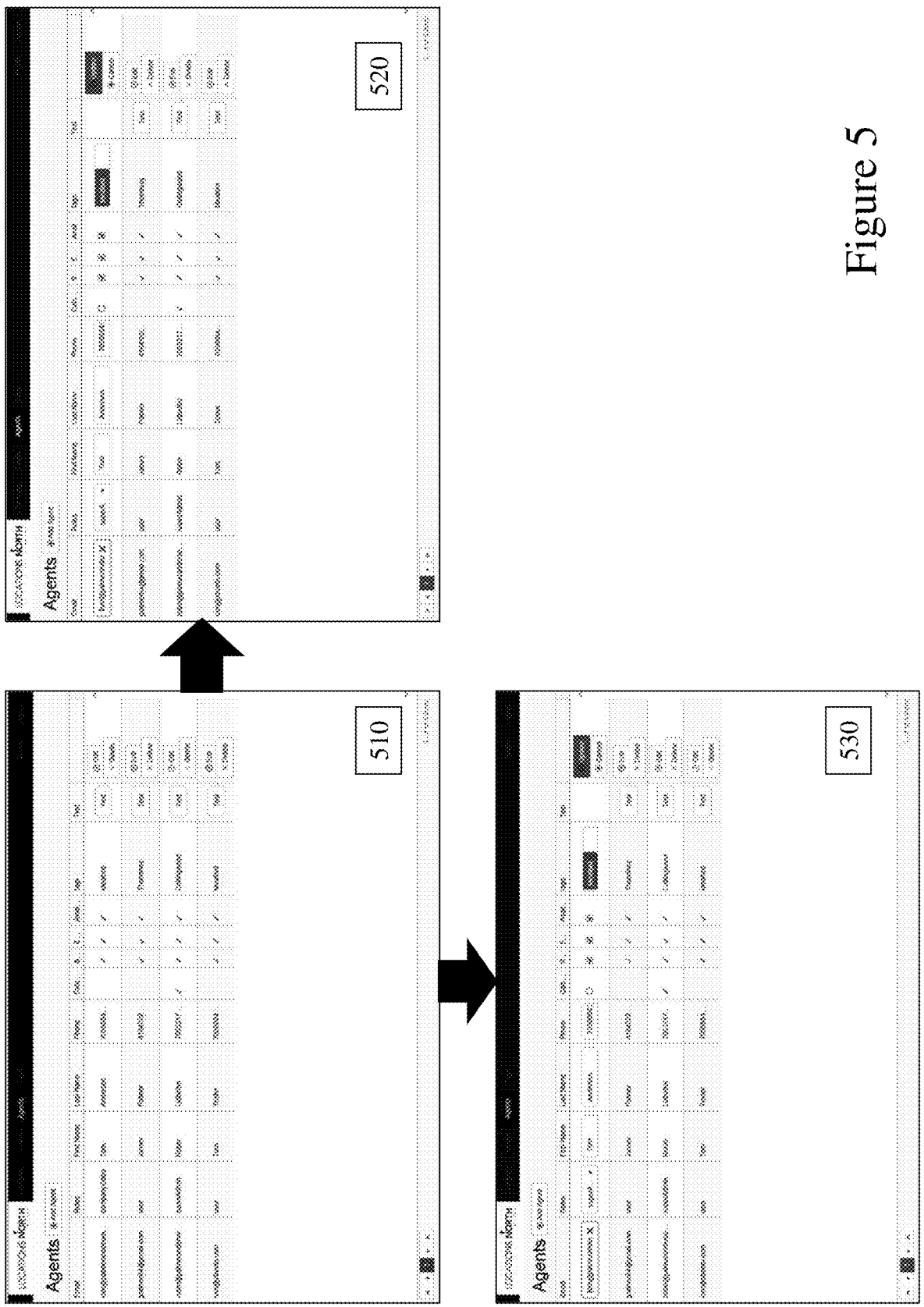
FIG. 5 exemplary screenshots of an application according to an embodiment of the invention relating to a real estate brokerage.

Now referring to FIG. 5 there are depicted first to third screenshots 510 to 530 respectively of an application according to an embodiment of the invention relating to a real estate brokerage exploiting a CMS-CMAP. In first screenshot 310 in FIG. 3 if the user elects to view/add agents then they are initially directed to first screen shot 510 in FIG. 5. Accordingly, this presents to the user the details of the current agents associated with the service provider, e.g. Locations North. In this instance four agents, Tom Andersen, James Palmer, Tom Tester, and Robin Lidbetter are listed together with contact details, roles, availability, tags, etc. Also identified is a "Catchall" field wherein if a lead is parsed to an agent and not accepted within the allotted time, as discussed above, then the lead proceeds to be communicated to those selected within the "Catchall." SMS Email If the user selects "Edit" in respect of an agent then they are able to change the data relating to that agent including contact means wherein "S . . . " as displayed equates to SMS (i.e. text) and "E . . . " equates to email. Additionally, their availability may be adjusted, tags, as well as other aspects of the agent's profile. If within any of the screenshots depicted in FIGS. 3 and 4 or first and second screenshots 510 and 520 in FIG. 5 then the user is presented with third screenshot 530 representing the profile of the "super user" for the service provider who created the account for the service provider, in this instance "Robin Lidbetter."

Figure 6:
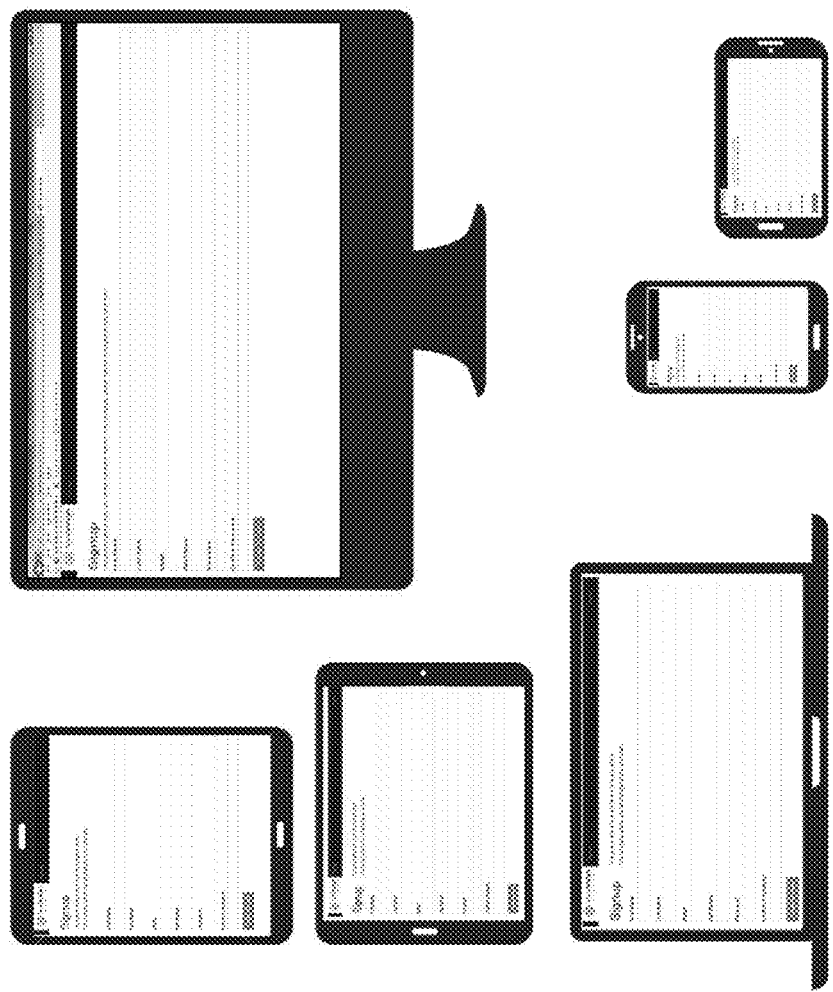
FIG. 6 depicts an exemplary login screen of an application according to an embodiment of the invention upon a range of electronic devices.

Referring to FIG. 6 there are depicted exemplary login screens of an CMS-CMAP application according to an embodiment of the invention upon a range of electronic devices wherein the CMS-CMAP application may have been designed and/or implemented as reactive and/or adaptive to the varying display dimensions of different electronic devices, e.g. a PED or FED, or the same electronic device, e.g. a PED, in different orientations.

Figure 7:
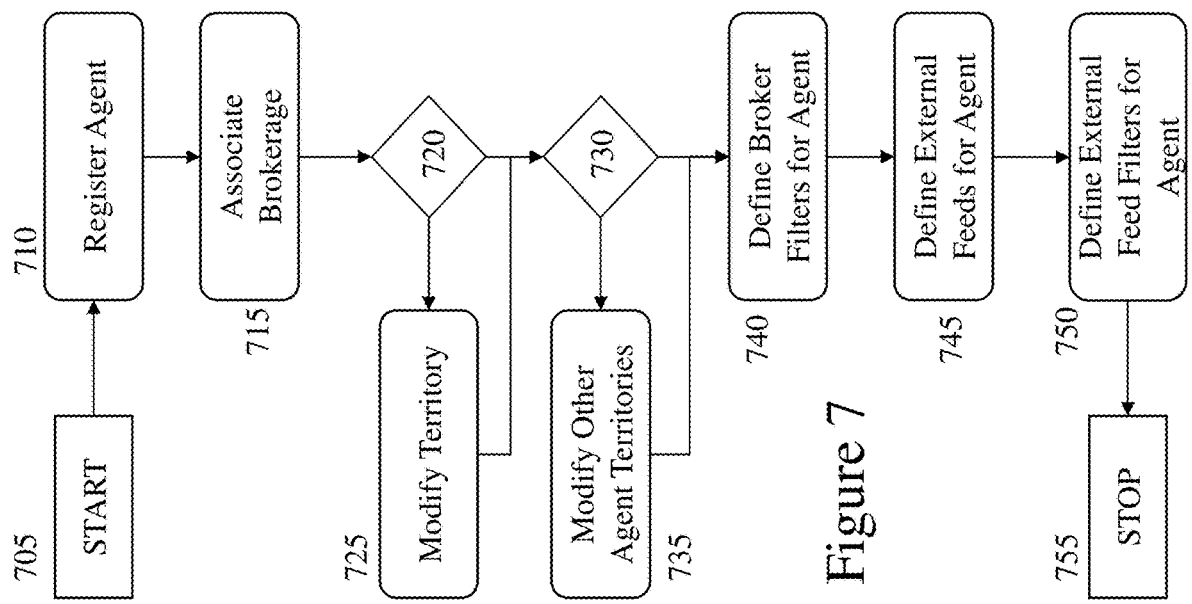
FIG. 7 depicts an exemplary flowchart for an application according to an embodiment of the invention relating to adding a new user.

Referring to FIG. 7 there is depicted an exemplary flowchart for an application according to an embodiment of the invention relating to adding a new user. Within the description the flow is described with respect to a real estate environment although it would be evident to one skilled in the art that other enterprises, industries, organizations, etc. may exploit embodiments of the invention. As depicted the process comprises the following steps:

Step 705—wherein the process starts with a user accessing the CMS-CMAP as a registered user and selects to register a new agent such as depicted in first screenshot 510 in FIG. 5;

Step 710—wherein the new agent's details are added;

Step 715—wherein any enterprise associations are made, e.g. for a realtor with the brokerage such as Tom Andersen with the Meaford office of Locations North as depicted in first screenshot 510 in FIG. 5;

Step 720—wherein a decision is made as to whether the territory associated with the enterprise association made in step 715 is to be made wherein a positive determination leads to step 725 otherwise the process proceeds to step 730;

Step 725—the territory associated with the enterprise association for the new agent is modified, such that for example a new agent may be restricted initially to a portion of the overall territory or alternatively to specific clients, types of activity etc. (e.g. downtown Meaford and commercial or Wasaga Beach area and rentals);

Step 730—based upon the determination and amendments made with respect to the new agent's territory a determination is made in step 730 as to whether adjustments will be made to other agent's territories wherein a positive determination leads to step 735 otherwise the process proceeds to step 740;

Step 735—adjustments are made to other agent territories;

Step 740—wherein broker filters for the agent are established either in association with their territory or in addition to;

Step 745—wherein external feeds are associated with the new agent, such that for example a trainee may be only engaged through another agent avoiding issues with direct public engagement initially or the new agent may be only fed leads arising from walk-in customers to the Meaford office for example;

Step 750—wherein external feed filters are associated with the new agent and their external feed sources, such that for example a real estate trainee may only receive leads in respect of properties below a particular threshold;

Step 755—the process stops.

Figure 8:
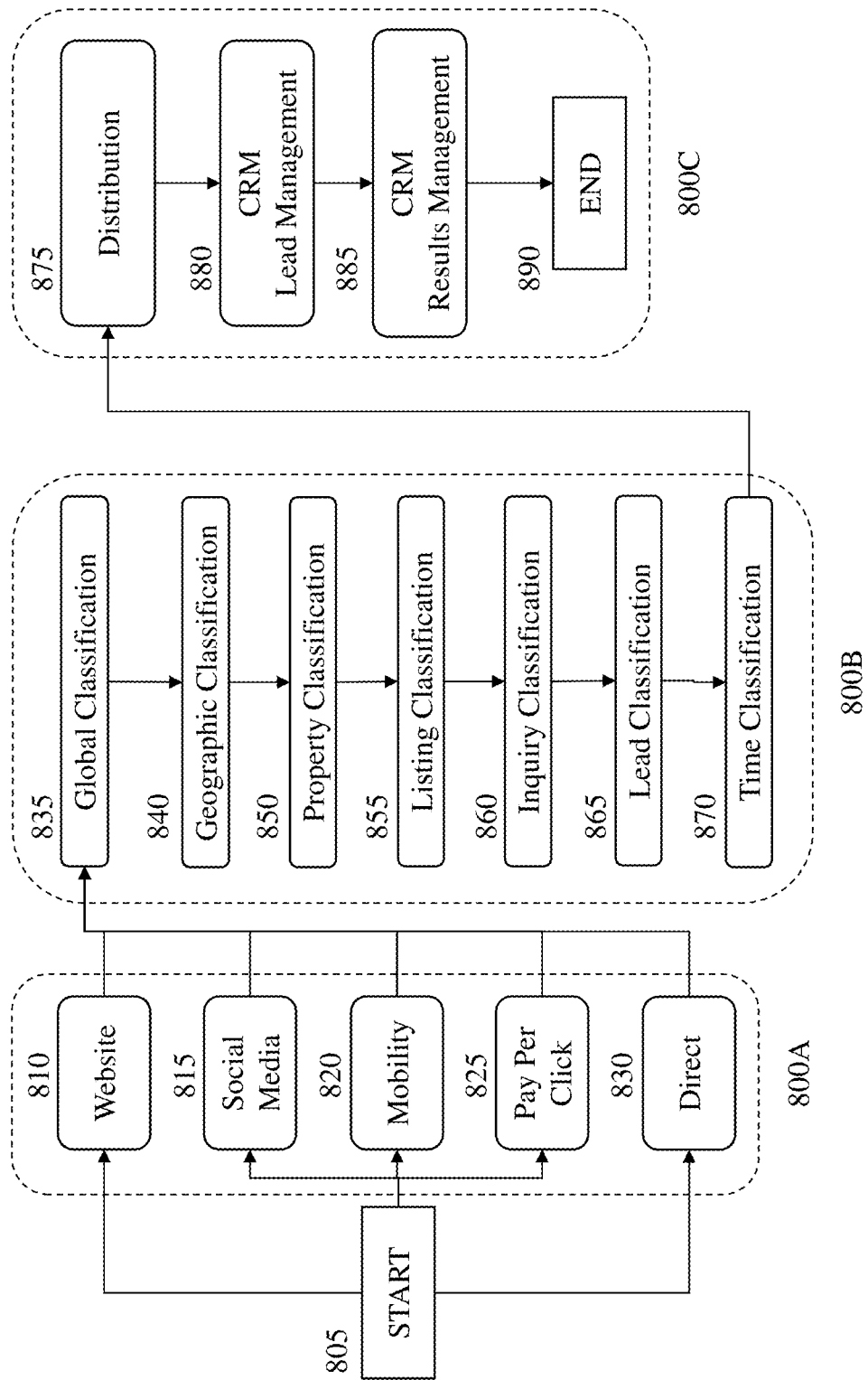
FIG. 8 depicts an exemplary flowchart for an application according to an embodiment of the invention relating to classifying a new contact or lead.

FIG. 8 depicts an exemplary flowchart for an application according to an embodiment of the invention relating to classifying a new contact or lead. Within the description the flow is described with respect to a real estate environment although it would be evident to one skilled in the art that other enterprises, industries, organizations, etc. may exploit embodiments of the invention. As depicted the process comprises first to third sub-flows 800A to 800C representing lead generation 800A, lead classification 800B, and lead processing 800C which contain the following steps:

Step 805—wherein the process starts and awaits triggers from a lead being generated through one of the lead resources 810 to 830;

Steps 810 to 830—wherein each represents a lead resource through which a CONCUS may engage the enterprise and provide information either in terms of acquiring an asset provided by or managed by the enterprise executing the CMS-CMAP. As indicated these include website 810; social media feeds 815; mobility feeds 820 such as text, email, etc.; pay per click 825 wherein the enterprise exploits click-through advertising in other online locations; and direct 830 wherein a CONCUS engages through telephone or in-person;

Step 835—wherein an initial global classification of the received lead from a lead source is undertaken as some enquiries may be incorrectly associated to the enterprise by the CONCUS, for example, or routed to a specific individual;

Step 840—wherein geographic classification processing is performed such that the enquiry is associated to the correct geographic office or if it has been received incorrectly then it may be fed as a referral to the correct office, e.g. the Collingwood, Ontario office really should have been Collingwood Cove, Alberta;

Step 850—wherein property classification(s) are verified as perhaps a routing to the Meaford office for a commercial property purchase is incorrect as no commercial transactions are undertaken at Meaford, rather they are performed by the Collingwood office;

Step 855—wherein a listing classification is made as some agents may be associated with specific listings whereas others may be general or there may be no associated listing;

Step 860—wherein the inquiry is classified based upon content, source etc. as a direct text regarding a specific listing would be associated to a high priority whereas a simple click-through from a website may be handled at lower priority or be associated to specific agents, administration personnel etc., Step 865—wherein additional lead classification activities are performed, such as associating the lead with a known buyer for example;

Step 870—wherein any time related classification is performed, e.g. does the lead relate to an open house, a sealed bid process, require addressing with a predetermined time period, etc.;

Step 875—distribution of the lead(s) is undertaken based upon data generated through the classification sub-flow 800B and standard processes established within the CMS-CMAP;

Step 880—the lead data from the CMS-CMAP is interfaced to the enterprise customer relationship management (CRM) tool(s) for lead tracking/management after initial processing such that their current standard tool and process flows for lead tracking, lead fulfilment, etc.;

Step 885—the CMS-CMAP is interfaced to the enterprise customer relationship management (CRM) tool(s) for result tracking/management such that outputs from their current standard tool and process flows for result/fulfilment etc. can be interfaced back to the CMS-CMAP such that classifications/distributions etc. may be modified where appropriate;

Step 890—wherein the process ends.

Figure 9:
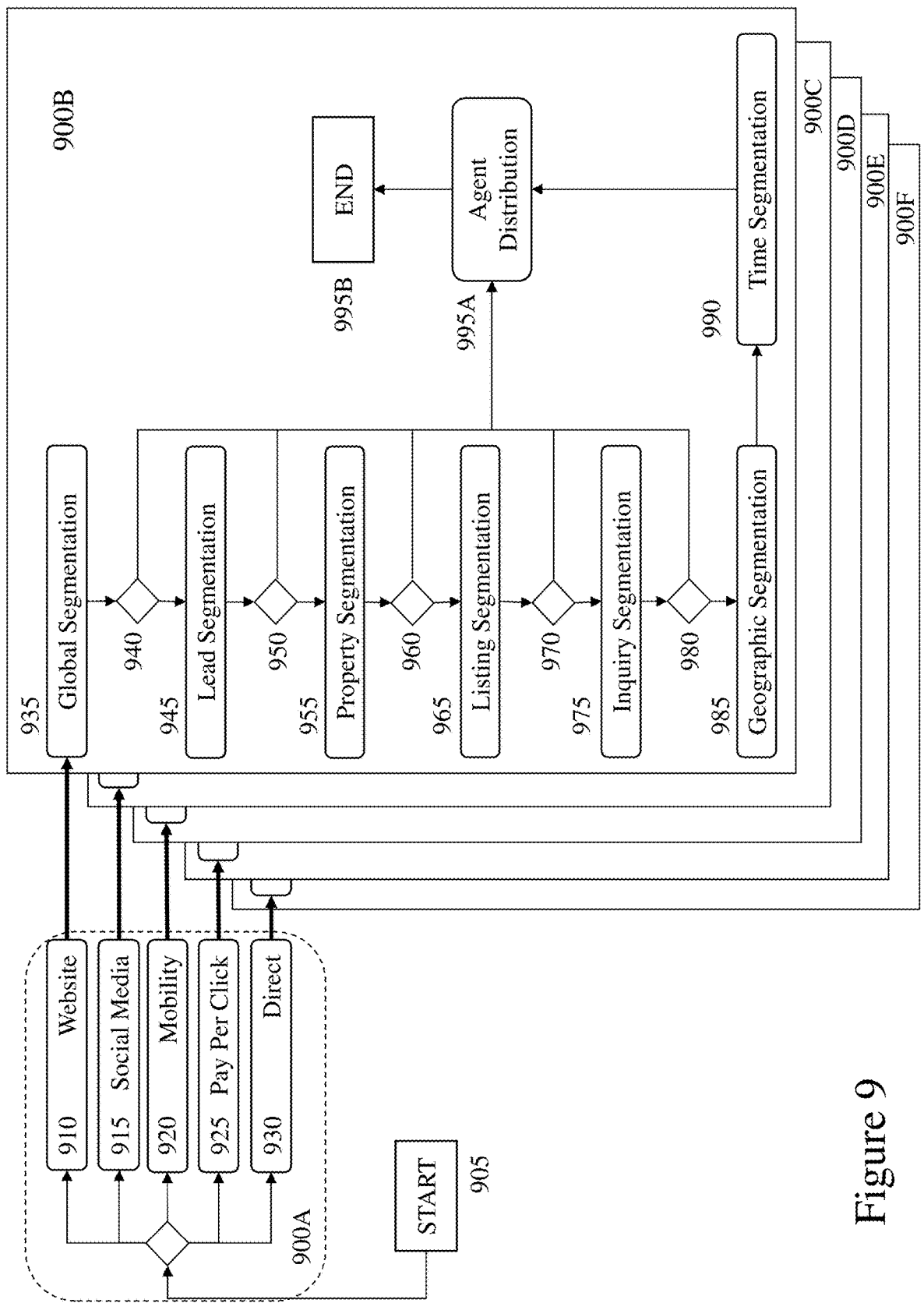
FIG. 9 depicts an exemplary flowchart for an application according to an embodiment of the invention relating to segmentation of new contact or lead based upon contact/lead source.

Now referring to FIG. 9 there is depicted an exemplary flowchart for an application according to an embodiment of the invention relating to segmentation of new contact or lead based upon contact/lead source. Accordingly as depicted the process flow begins at step 905 before proceeding to sub-flow 900A wherein the received lead is filtered and pre-processed according to steps 910 to 930 accordingly to whether the lead was derived from website, social media, mobility, pay-per-click or directly. From each of steps 910 to 930 respectively the process proceeds to a corresponding sub-flow of first to fifth segmentation workflows 900B to 900F respectively. Of these only first segmentation workflow 900B is described in detail although each of second to fifth segmentation workflows 900C to 900F respectively follow essentially similar flows although the segmentation sequencing, segmentation conditions, etc. may be different as established within the CMS-CMAP.

Accordingly referring to first segmentation workflow 900B this consists of first to seventh segmentation stages 935, 945, 955, 965, 975, 985 and 990 respectively interspersed with first to sixth decisions 940, 950, 960, 970, and 980 respectively. Each of the first to sixth decisions 940, 950, 960, 970, and 980 respectively determines whether matching of the processed input received at the CMS-CMAP can be pushed for agent distribution in step 955A or whether additional segmentation is required. Accordingly, the process flow depicted in FIG. 9 can adapt to handling multiple simultaneous inputs, e.g. customer leads, as well as handling a single input with multiple listings or elements. Accordingly considering first to seventh segmentation stages 935, 945, 955, 965, 975, 985 and 990 respectively then these selectively apply a series of filtering (segmentation) stages to the received data relating to global, lead, property, listing, inquiry, geographic, and time wherein as the filtering stages proceed matches to agents arise based upon the specific aspects associated with each agent. Accordingly, those matches result in the process proceeding from any of first to sixth decisions 940, 950, 960, 970, and 980 respectively to step 995A wherein the agents are contacted as the settings within their profiles within the CMS-CMAP define after which the process proceeds to step 995B and stops.

Accordingly, the process flow as described and depicted in FIG. 9 may be viewed from the perspective of an enterprise, e.g. Locations North realtors, as providing them with an integration/lead capture process coupled with a segmentation based upon the criteria that they set. Accordingly, considering first sub-flow 900A then this provides for the integration of their lead streams from all sources including as depicted, but not limited to, Website, Social Media (e.g. Facebook, Twitter), Mobility, Pay Per Click, and Direct (e.g. the manual entry of brokerage network referrals, etc.). As captured each lead would retain a tag identifying its source so that this aspect is maintained through all subsequent processing as this becomes in many enterprises an important aspect of reporting analytics.

Subsequently, these leads captured from these multiple sources are segmented accordingly to multiple categories of criteria through first to fifth segmentation workflows 900B to 900F respectively. Accordingly, considering these segmentations these may include, for example:

Global—e.g. sales versus rental, seasonal versus annual;
Geographical—in terms of the different communities the Locations North brokerage serves, e.g. Collingwood, Blue Mountains, Thornbury, Meaford, Grey Highlands, Creemore, Wasaga Beach, etc.;
Property Type—e.g. residential or commercial;
Listing Type—e.g. Brokerage listings, Non-Brokerage listings
Inquiry—e.g. a variety of rich content downloads and other calls-to-action may be received and processed; and
Lead—e.g. buyer, seller, renter.

So any given lead could potentially have multiple categories or tags associated with it, for example, {Grey Highlands/Residential sales/Non-Brokerage Listing/Buyer/Pay Per Click}. Accordingly, automated distribution of the leads based upon these tags and their segmentation actions within the first to fifth segmentation workflows 900B to 900F respectively result in the leads being filtered and communicated to the agents directly. Each of the first to fifth segmentation workflows 900B to 900F respectively may output to a different agent for the same set of tags if the enterprise wishes, for example, Pay per Click leads to be handled separately to Social Media leads.

According to the configurations established within the first to fifth segmentation workflows 900B to 900F respectively then a subset of agents within the enterprise are pushed the leads through the CMS-CMAP by the communication methods associated with themselves within their profile. Hence Robin may be communicated to by email only, Sarah by telephone, and Jim by email and text. Accordingly, the rules established based on the multiple segmentation categories would allow, without going into detail (for which see FIG. 10 below), some categories of leads would be distributed directly to specific Agents or small groups of Agents or other processes. As noted supra the CMS-CMAP is not intended to replace any existing CRM employed by the enterprise with respect to lead tracking but rather provide the enterprise with a modular, configurable, interface for classifying, tagging, and segmenting leads such that even leads within a common social media platform, e.g. Facebook, may be varied according to the specific webpage or the time/location of the lead generator. Various detailed reporting of leads by source, segment and segment categories, distribution, result, etc., and combinations thereof may be generated within the CMS-CMAP directly or based upon data extracted/pushed/pulled from the enterprise's CRM to the CMS-CMAP. Accordingly, considering real estate then the CMS-CMAP records may be augmented with a tag identifying a listing lead as being sold, or in another example a lead may be tagged if they bought another property with the help of one of the enterprise's Agents.

Figure 10:
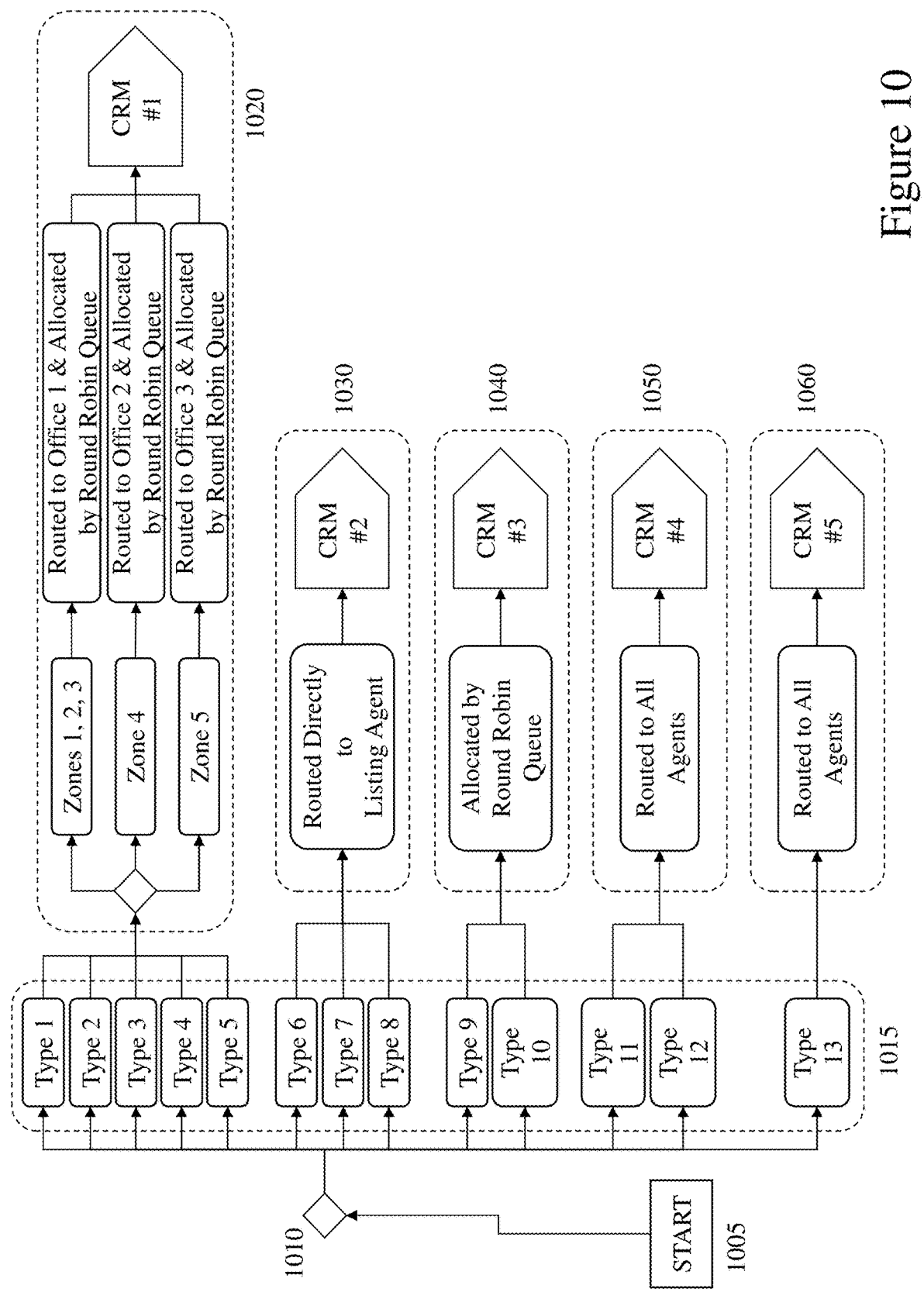
FIG. 10 depicts an exemplary flowchart for an application according to an embodiment of the invention relating to allocation of new contacts or leads within an application based upon contact/lead source.

Now referring to FIG. 10 there is depicted an exemplary flowchart for an application according to an embodiment of the invention relating to the distribution of new contacts or leads within the application based upon contact/lead source. As depicted the process begins at step 1005 before proceeding to strep 1010 wherein a determination as to the type of lead is made. Accordingly, the process then proceeds via step 1015 to first to fifth sub-flows 1020 to 1060 respectively. Accordingly, it can be seen that whilst there are considered within this exemplary CMS-CMAP as configured by the enterprise to be 13 types of lead these are distributed through only 5 sub-flows. Accordingly, step 1015 may be viewed as exemplifying an alternate embodiment of first segmentation workflow 900B or second to fifth workflows 900C to 900F. Accordingly there is depicted the following mapping of type to sub-flow:

First sub-flow 1020: Types 1 to 5;
Second sub-flow 1030: Types 6 to 8;
Third sub-flow 1040: Types 9 and 10;
Fifth sub-flow 1050: Types 11 and 12; and
Sixth sub-flow 1060: Type 13.

Now referring to first sub-flow 1020 then this comprises the steps of determining initially the zone of the territory to which the lead relates wherein leads from zones 1, 2, and 3 are routed to Office 1, zone 4 to Office 2, and zone 5 to Office 3. Within each office the leads are allocated by a round robin queue process before the process proceeds to engage the enterprise's CRM. In contrast second sub-flow 1030 routes the leads directly to the listing agent before proceeding to engage the enterprise's CRM. Types 9 and 10 within third sub-flow 1040 are directly allocated via a round robin queue across all offices and agents. Types 11 and 12 within fourth sub-flow 1050 are routed to all agents simultaneously and handled on a first response basis. Similarly, type 13 leads are routed to all agents simultaneously but are handled through fifth sub-flow 1060 so that their engagement to the enterprise CRM is through a different process.

Accordingly, it would be evident that FIG. 10 depicts a primary lead distribution flow for a CMS-CMAP according to an embodiment of the invention. Now consider the following association of leads/enquiries with types:

Type 1: Non-Brokerage Listings;
Type 2: Pay-per-Click (PPC) Listings;
Type 3: Sellers;
Type 4: Rich Content Downloads;
Type 5: Website triggered Call-to-Action;
Type 6: Locations North Brokerage Listings;
Type 7: Featured Home(s) of the Week;
Type 8: Mobility Listing Inquiries;
Type 9: Rentals;
Type 10: Rental Rich Content Downloads;
Type 11: Commercial;
Type 12: Commercial Rich Content Downloads; and
Type 13: Snap Engage Inquiries.

Accordingly, as depicted in FIG. 10 Types 1 to 5 are routed according to the process flow depicted to first sub-flow 1020. Within first sub-flow 1020 then leads of Types 1 to 5 are routed/distributed according to the same process. Accordingly, the Locations North territory is broken down into 5 zones, Zone 1—Collingwood, Zone 2—Eastern, Zone 3—Western, Zone 4—Thornbury, and Zone 5—Meaford based upon three Offices, namely Office 1—Collingwood, Office 2—Thornbury, and Office 3—Meaford. As such all leads within Zones 1-3 are distributed to Agents within Office 1—Collingwood on the basis of a round robin queue, all leads within Zone 4 to Agents within Office 2, and all leads within Zone 5 to Agents within Office 3. For example, the Collingwood office may have 35 Agents, Thornbury 10 Agents, and Meaford 15 Agents. Optionally, rather than a round robin queue being employed per received lead then the round robin queue may be established upon other basis such as predetermined periods of time, e.g. day, days, week, etc. or a quantity of leads such that, for example, each Agent will get 10 leads before their turn within the round robin queue is expended and the process proceeds. Optionally, other allocation methods other than round robin may be employed without departing from the scope of the invention.

Also as depicted in FIG. 10 Types 6 to 8 are routed according to the process flow depicted to second sub-flow 1030 which as they are Locations North Brokerage Listings, Featured Home(s) of the Week, and Mobility Listing Inquiries; are distributed directly to the listing Agent. Similarly, Types 9 ad 10 relating to Rentals and Rental Rich Content Downloads are routed as depicted by third sub-flow 1040 wherein all Agents are part of a round robin sequencing for these. Types 11 and 12 relating to Commercial and Commercial Rich Content Downloads are routed according to fourth sub-flow 1050 wherein they are routed to all Agents in parallel as are Type 13 leads relating to Snap Engage Inquiries. However, it would be evident that as different types are added different routing rules may be established and/or added and/or amended for these. For example, a chat system associated with the enterprises web site encouraging a user to engage directly with an Agent through web based video chat features may route the enquiry only to those actually within one of the offices, Offices 1 to 3, at that instant. Within another embodiment of the invention the CMS-CMAP may schedule Agents such that they have predetermined time periods where they will be the engaging Agent for a particular period of time.

Accordingly, embodiments of the invention provide a single software interface for gathering and integrating leads from multiple online sources, e.g. the enterprise office(s), website(s), listings generated through Data Distribution Facilities (DDF) and/or Internet Data Exchange (IDX) sources from other Brokerages, social media, Google Adwords, etc., as well as enable manual lead data entry. The CMS-CMAP allows for these leads to be intelligently sorted, stored, and/or tagged according to a variety of criteria including but not limited to:

- Multiple MLS property criteria (geographically; by whether it is a residential, commercial or rental listing; and by additional attributes such as waterfront, recreational and luxury homes, or seasonal and yearly rentals, etc.); and
- Multiple Brokerage-defined criteria (first-time homebuyers, investment homebuyers, seasonal renters, various call-to-action responses, etc.)

Subsequently the CMS-CMAP allows for the intelligent distribution of the leads directly to individual Agents, e.g. realtors, or indirectly through multiple round-robin queues created according to a variety of brokerage-defined criteria. Each Agent would typically belong to some or all of these queues on the basis of multiple Brokerage-defined tags assigned depending upon his or her specific geographical location, office, area of specialty, etc.). Each Agent will then receive leads in the manner that he or she wishes (by email and/or SMS and/or his or her personal CRM system or an enterprise-wide CRM system). The CMS-CMAPs according to embodiments of the invention may interface to a variety of industry-specific and generic CRM systems, facilitating systematic follow-up and lead management generally with respect to lead tracking, analytical reporting, etc.

Within the embodiments described supra in respect of FIGS. 3 through 10 have been described primarily from the viewpoint of a realtor/real estate MSME such as a brokerage. As such the MSME is an independent enterprise, e.g. Locations North as represented by first service provider 170C in FIGS. 1 and 2 respectively, affiliated with a larger national brand, e.g. Royal LePage, as represented by second service provider network 170B in FIGS. 1 and 2 respectively. Typically, such MSMEs do not possess integrated lead management tools as part of an overall set of business solutions including SM, CRM, etc. and in many instances have none or limited business solutions such as SM, CRM. As such the CMS-CMAP provides such MSMEs with an integrated lead management tool which is configurable from a single user through a few, tens to hundreds and beyond as the MSME grows and expands.

It would therefore be evident to one skilled in the art that for an MSME today they are marketing and engaging customers and potential customers on more parallel channels than ever before today. At the same time a CMS-CMAP according to embodiments of the invention must allow its configuration to be easily modified and adjusted by the MSME without significant skill and/or resources on the part of the MSME. Accordingly, CMS-CMAPs according to embodiments of the invention can adapt to evolving marketing channels with ease as the MSME can add a new channel and define distribution rules for that new channel. Referring to FIGS. 9 and 10 respectively, for example, then the user may assign a new channel to an existing class such as those defined in steps 910 to 930 where these were, for example, initially defined as being linked to web site, social media, mobility, pay-per-click or directly respectively. These are then processed by a corresponding segmentation sub-flow such as first to fifth segmentation workflows 900B to 900F respectively. Within these are agent distribution steps 995A which based upon the type of lead, e.g. one of Types 1 to Type 13, are routed to the appropriate sub-flow of the, as depicted, first to fifth sub-flows 1020 to 1060 in FIG. 10. Accordingly, if a new channel, e.g. LinkedIn™ is established then this may be associated to step 915 by classing it as a Social Media channel. Accordingly, data received through this new channel where it relates to Type 1 (Non-Brokerage Listings) would be routed via first sub-flow 1020 in FIG. 10, whilst if it related to Type 9 (Rentals) it would be routed via fourth sub-flow 1040 in FIG. 10.

Within the first sub-flow 1020 in FIG. 10 leads are processed further by geographical zones. These may be established based upon one or more processes such as associating a zone with one or more postal districts, e.g. by postcode or zip code, one or more telephone area codes, town, region, state, province, country, political wards, etc. Alternatively, geographical zones may be established through a mapping interface of the CMS-CMAP allowing the user to view a map and assign zones using predefined geometries, free-hand, free-hand with closest significant landmark association (e.g. drawing a line selects a highway, Interstate, railway, river, etc.). Accordingly, MSMEs benefit from a discrete user configurable software solution allowing them to receive customer input from a disparate array of sources and based upon tags and content within the customer input route the input to one or more MSME personnel.

Similarly, the CMS-CMAP allows the MSME to exploit existing channels of communication, e.g. telephony, mobile telephony, pager, and email, for example, and subsequently newer channels such as text and SMS, as well as allowing postings to user social media accounts, etc. Subsequently, if new channels of contact are added then these may be offered within the appropriate sections of the CMS-CMAP, such as agent profiles, allowing the new channel to be added to one or agents.

Whilst embodiments of the invention have been described primarily from the viewpoint of a realtor/real estate MSME such as a brokerage it would be evident that the CMS-CMAP according to embodiments of the invention may be exploited by other MSMEs within a variety of industries including, but not limited to, those within Entertainment, Government, Telecommunications, Hospitality industry/Tourism, Mass media, Healthcare/hospitals, Public health, Information technology, Waste disposal, Financial services, Banking, Insurance, Investment management, Consumer Goods, Professional services, Accounting, Legal services, Gambling, Retail sales, Franchising, Real estate, Education etc. and other elements of the service sector (tertiary sector) of the economy, i.e. activities where people offer their knowledge and time to improve productivity, performance, potential, and sustainability, what is termed affective labor. The basic characteristic of this sector is the production of services instead of end products. Services (also known as "intangible goods") include attention, advice, access, experience, and discussion.

However, it would be evident that MSMEs may also be within the secondary sector of the economy which is generally considered to be those portions of the economy that create a finished, usable product by either is direct production or construction. Similarly, MSMEs may also be within the primary sector of the economy which is generally considered to be those portions of the economy making direct use of natural resources. This includes, but is not limited to, agriculture, forestry, fishing and mining. Manufacturing industries that aggregate, pack, package, purify or process raw materials close to the primary producers are normally considered part of this sector, especially if the raw material is unsuitable for sale or difficult to transport long distances.

Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Implementation of the techniques, blocks, steps and means described above may be done in various ways. For example, these techniques, blocks, steps and means may be implemented in hardware, software, or a combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above and/or a combination thereof.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be rearranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

Furthermore, embodiments may be implemented by hardware, software, scripting languages, firmware, middleware, microcode, hardware description languages and/or any combination thereof. When implemented in software, firmware, middleware, scripting language and/or microcode, the program code or code segments to perform the necessary tasks may be stored in a machine readable medium, such as a storage medium. A code segment or machine-executable instruction may represent a procedure, a function, a subprogram, a program, a routine, a subroutine, a module, a software package, a script, a class, or any combination of instructions, data structures and/or program statements. A code segment may be coupled to another code segment or a hardware circuit by passing and/or receiving information, data, arguments, parameters and/or memory content. Information, arguments, parameters, data, etc. may be passed, forwarded, or transmitted via any suitable means including memory sharing, message passing, token passing, network transmission, etc.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory. Memory may be implemented within the processor or external to the processor and may vary in implementation where the memory is employed in storing software codes for subsequent execution to that when the memory is employed in executing the software codes. As used herein the term "memory" refers to any type of long term, short term, volatile, nonvolatile, or other storage medium and is not to be limited to any particular type of memory or number of memories, or type of media upon which memory is stored.

Moreover, as disclosed herein, the term "storage medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "machine-readable medium" includes, but is not limited to portable or fixed storage devices, optical storage devices, wireless channels and/or various other mediums capable of storing, containing or carrying instruction(s) and/or data.

The methodologies described herein are, in one or more embodiments, performable by a machine which includes one or more processors that accept code segments containing instructions. For any of the methods described herein, when the instructions are executed by the machine, the machine performs the method. Any machine capable of executing a set of instructions (sequential or otherwise) that specify actions to be taken by that machine are included. Thus, a typical machine may be exemplified by a typical processing system that includes one or more processors. Each processor may include one or more of a CPU, a graphics-processing unit, and a programmable DSP unit. The processing system further may include a memory subsystem including main RAM and/or a static RAM, and/or ROM. A bus subsystem may be included for communicating between the components. If the processing system requires a display, such a display may be included, e.g., a liquid crystal display (LCD). If manual data entry is required, the processing system also includes an input device such as one or more of an alphanumeric input unit such as a keyboard, a pointing control device such as a mouse, and so forth.

The memory includes machine-readable code segments (e.g. software or software code) including instructions for performing, when executed by the processing system, one of more of the methods described herein. The software may reside entirely in the memory, or may also reside, completely or at least partially, within the RAM and/or within the processor during execution thereof by the computer system. Thus, the memory and the processor also constitute a system comprising machine-readable code.

In alternative embodiments, the machine operates as a standalone device or may be connected, e.g., networked to other machines, in a networked deployment, the machine may operate in the capacity of a server or a client machine in server-client network environment, or as a peer machine in a peer-to-peer or distributed network environment. The machine may be, for example, a computer, a server, a cluster of servers, a cluster of computers, a web appliance, a distributed computing environment, a cloud computing environment, or any machine capable of executing a set of instructions (sequential or otherwise) that specify actions to be taken by that machine. The term "machine" may also be taken to include any collection of machines that individually or jointly execute a set (or multiple sets) of instructions to perform any one or more of the methodologies discussed herein.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method comprising:
   establishing a set of rules to be stored upon a server, the set of rules comprising:
   a first rule of a plurality of first rules each associated with at least one of a specific tag type and a specific tag value; and
   a second rule of a plurality of second rules each relating to a portion of an internal organization and a group of personnel; wherein
   each tag of the plurality of tags is established in dependence upon at least one of a format of a plurality of formats and a lead source of a plurality of lead sources;
   each lead source of the plurality of lead sources is associated with a different communication format;
   the set of rules mediate the distribution of a related set of data where each related set of data is established in dependence upon a set of received data and at least a tag of a plurality of tags;
   the set of received data is stored upon at least one of another server and a memory accessible to the server; and
   the stored set of data was received in the format of the plurality of formats from the lead source of the plurality of lead sources.

2. The method according to claim 1, further comprising receiving the set of received data as lead data from an electronic device associated with a user; and
   distributing the related set of data; wherein
   the electronic device transmits the lead data to the server via a communications network; and
   the lead data is established upon the electronic device by the user within a software application associated with a predetermined lead source of the plurality of lead sources selected by the user.

3. The method according to claim 1, further comprising processing the received set of data prior to its distribution with a process comprising:
   applying an initial global classification to the received set of data wherein further processing of the received set of data is either terminated, directly routed to an individual within the enterprise or subject to additional processing; wherein
   the additional processing comprises applying at least one classification process of a plurality of classification processes to the received set of data; and
   either:
   each classification process of the plurality of classification processes is selected from the group comprising a global classification process, a geographic classification of the enterprise process, a geographic classification process, a property classification process, a listing classification process, a lead classification process, and a time classification process;
   or:
   the plurality of classification processes are selected from the group comprising a global classification process, a geographic classification of the enterprise process, a geographic classification process, a property classification process, a listing classification process, a lead classification process, and a time classification process; and
   each classification process of the plurality of classification processes is configured according to the lead source of the plurality of lead sources from which the set of data was received.

4. The method according to claim 1, wherein at least one of:
   each first rule of the plurality of first rules is associated with at least one of a specific tag type and a specific tag value and relates to one of the format of the plurality of formats, the lead source of the plurality of lead sources, and a classification process; and
   the classification process is selected from the group comprising a global classification process, a first geographic classification process established by the enterprise which is independent of the user, and a second geographic classification process associated with a geographical location of the user;
   and
   each second rule of the plurality of second rules relating to a portion of the internal organization and personnel of the enterprise relates to one or more classification processes where each classification process is selected from the group comprising a property classification process, a listing classification process, a lead classification process, and a time classification process.

5. The method according to claim 1, further comprising processing the received set of data prior to its distribution with a process comprising:
applying an initial global classification to the received set of data wherein further processing of the received set of data is either terminated, directly routed to an individual within the enterprise or subject to additional processing; and
applying additional processing comprising applying a predetermined subset of a plurality of classification processes to the received set of data; wherein
the plurality of classification processes are selected from the group comprising a global classification process, a geographic classification of the enterprise process, a geographic classification process, a property classification process, a listing classification process, a lead classification process, an inquiry classification and a time classification process;
each classification process of the plurality of classification processes is configured according to the lead source of the plurality of lead sources from which the set of data was received; and
the classification process associates a priority to the received set of data in dependence upon the lead source of the plurality of lead sources from which the set of data was received.

6. The method according to claim 1, further comprising
determining whether an assigned individual established by the second rule of the plurality of second rules relating to the portion of the internal organization and personnel of the enterprise has not accepted the distributed related set of data; and
distributing the relating set of data to a subset of the personnel of the enterprise independent of the portion of the internal organization; wherein
each individual within the subset of the personnel of the enterprise associated with a specific tag value.

7. The method according to claim 1, further comprising processing the received set of data prior to its distribution with a process comprising:
applying an initial global classification to the received set of data wherein further processing of the received set of data is either terminated, directly routed to an individual within the enterprise or subject to additional processing; and
the additional processing comprises applying a lead classification process followed sequentially by a predetermined subset of a plurality of classification processes to the received set of data; wherein
either:
the predetermined subset of the plurality of classification processes are established in dependence upon a result of the lead classification process;
or:
the lead classification process establishes an outcome of a plurality of outcomes;
the predetermined subset of the plurality of classification processes are established in dependence upon the outcome of the plurality of outcomes established by the lead classification process;
each second rule of the plurality of second rules relating to a portion of the internal organization and personnel of the enterprise is associated with a predetermined subset of the plurality of outcomes.

8. The method according to claim 1, further comprising pre-processing the received set of data with a pre-processing workflow of a plurality of pre-processing workflows; and
processing the pre-processed received set of data with a segmentation workflow of a plurality of workflows; wherein
the pre-processing workflow of the plurality of pre-processing workflows is established in dependence upon the lead source of a plurality of lead sources; and
either:
the segmentation workflow of the plurality of segmentation workflows is established in dependence upon the lead source of a plurality of lead sources;
or:
the segmentation workflow of the plurality of segmentation workflows is established in dependence upon the lead source of a plurality of lead sources;
each segmentation workflow comprises a series of segmentation stages with a decision stage between each segmentation stage of the series of segmentation stages and its predecessor segmentation stage of the series of segmentation stages except for the first segmentation stage of the series of segmentation stages and the final segmentation stage of the series of segmentation stages;
each decision stage determines whether the received set of data as currently processed can be pushed for distribution or whether additional segmentation is required;
upon a determination of pushing for distribution the step of distributing is performed otherwise the next segmentation stage of the series of segmentation stages is executed; and
the final segmentation stage is a time based segmentation.

9. The method according to claim 1, wherein each second rule of a plurality of second rules is associated with a predetermined subset of the plurality of first rules.

10. The method according to claim 1, wherein a lead source of the plurality of lead sources is a website of social media platform comprising a plurality of webpages; and
the first rules of the plurality of first rules and the second rule of the plurality of second rules are established in dependence upon a webpage of the plurality of webpages from which the received set of data was generated.

11. A non-transitory computer-readable medium having instructions stored thereon that, when executed by a processing device, cause the processing device to
distribute a related set of data with a server wherein each related set of data is established in dependence upon a set of data stored upon the server and at least a tag of a plurality of tags; wherein
the distribution is mediated by a set of rules stored upon the server, the set of rules comprising a first rule of a plurality of first rules each associated with at least one of a specific tag type and a specific tag value and a second rule of a plurality of second rules each relating to a portion of an internal organization and a group of personnel;
the tag of the plurality of tags is established in dependence upon at least one of a format of a plurality of formats and a lead source of a plurality of lead sources;
the stored set of data was received in the format of the plurality of formats from the lead source of the plurality of lead sources; and
each lead source of the plurality of lead sources is associated with a different communication format.

12. The computer-readable medium according to claim 11, wherein the instructions are further to cause the processing device to:
prior to distributing the related set of data processing the received set of data by:
applying an initial global classification to the received set of data wherein further processing of the received set of data is either terminated, directly routed to an individual within the enterprise or subject to additional processing; wherein
the additional processing comprises applying at least one classification process of a plurality of classification processes to the received set of data; and
either:
each classification process of the plurality of classification processes selected from the group comprising a global classification process, a geographic classification of the enterprise process, a geographic classification process, a property classification process, a listing classification process, a lead classification process, and a time classification process;
or:
the plurality of classification processes are selected from the group comprising a global classification process, a geographic classification of the enterprise process, a geographic classification process, a property classification process, a listing classification process, a lead classification process, and a time classification process; and
each classification process of the plurality of classification processes is configured according to the lead source of the plurality of lead sources from which the set of data was received.

13. The computer readable medium according to claim 11, wherein at least one of:
each first rule of the plurality of first rules is associated with at least one of a specific tag type and a specific tag value and relates to one of the format of the plurality of formats, the lead source of the plurality of lead sources, and a classification process; and
the classification process is selected from the group comprising a global classification process, a first geographic classification process established by the enterprise which is independent of the user, and a second geographic classification process associated with a geographical location of the user;
and
each second rule of the plurality of second rules relating to a portion of the internal organization and personnel of the enterprise relates to one or more classification processes where each classification process is selected from the group comprising a property classification process, a listing classification process, a lead classification process, and a time classification process.

14. The computer-readable medium according to claim 11, wherein the instructions are further to cause the processing device to:
prior to distributing the related set of data processing the received set of data by:
applying an initial global classification to the received set of data wherein further processing of the received set of data is either terminated, directly routed to an individual within the enterprise or subject to additional processing; and
applying additional processing comprising applying a predetermined subset of a plurality of classification processes to the received set of data; wherein
the plurality of classification processes are selected from the group comprising a global classification process, a geographic classification of the enterprise process, a geographic classification process, a property classification process, a listing classification process, a lead classification process, an inquiry classification and a time classification process;
each classification process of the plurality of classification processes is configured according to the lead source of the plurality of lead sources from which the set of data was received; and
the inquiry classification process associates a priority to the received set of data in dependence upon the lead source of the plurality of lead sources from which the set of data was received.

15. The computer readable medium according to claim 11, wherein the instructions are further to cause the processing device to:
determine whether an assigned individual established by the second rule of the plurality of second rules relating to the portion of the internal organization and personnel of the enterprise has not accepted the distributed related set of data; and
distribute the relating set of data to a subset of the personnel of the enterprise independent of the portion of the internal organization; wherein
each individual within the subset of the personnel of the enterprise associated with a specific tag value.

16. The computer-readable medium according to claim 11, wherein the instructions are further to cause the processing device to:
prior to distributing the related set of data processing the received set of data by:
applying an initial global classification to the received set of data wherein further processing of the received set of data is either terminated, directly routed to an individual within the enterprise or subject to additional processing; wherein
the further processing comprises applying a lead classification process followed sequentially by a predetermined subset of a plurality of classification processes to the received set of data; and
the predetermined subset of the plurality of classification processes are established in dependence upon a result of the lead classification process.

17. The computer-readable medium according to claim 11, wherein the instructions are further to cause the processing device to:
prior to distributing the related set of data processing the received set of data by:
applying an initial global classification to the received set of data wherein further processing of the received set of data is either terminated, directly routed to an individual within the enterprise or subject to additional processing; and
applying additional processing comprises applying a lead classification process followed sequentially by a predetermined subset of a plurality of classification processes to the received set of data; wherein
the lead classification process establishes an outcome of a plurality of outcomes;
the predetermined subset of the plurality of classification processes are established in dependence upon the outcome of the plurality of outcomes established by the lead classification process;
each second rule of the plurality of second rules relating to a portion of the internal organization and personnel of the enterprise is associated with a predetermined subset of the plurality of outcomes.

18. The computer-readable medium according to claim 11, wherein the instructions are further to cause the processing device to:
prior to distributing the related set of data pre-process the received set of data with a pre-processing workflow of a plurality of pre-processing workflows; and
process the pre-processed received set of data with a segmentation workflow of a plurality of workflows; wherein
the pre-processing workflow of the plurality of pre-processing workflows is established in dependence upon the lead source of a plurality of lead sources; and
the segmentation workflow of the plurality of segmentation workflows is established in dependence upon the lead source of a plurality of lead sources.

19. The computer-readable medium according to claim 11, wherein the instructions are further to cause the processing device to:
prior to distributing the related set of data pre-process the received set of data with a pre-processing workflow of a plurality of pre-processing workflows; and
process the pre-processed received set of data with a segmentation workflow of a plurality of workflows; wherein
the pre-processing workflow of the plurality of pre-processing workflows is established in dependence upon the lead source of a plurality of lead sources;
the segmentation workflow of the plurality of segmentation workflows is established in dependence upon the lead source of a plurality of lead sources;
each segmentation workflow comprises a series of segmentation stages with a decision stage between each segmentation stage of the series of segmentation stages and its predecessor segmentation stage of the series of segmentation stages except for the first segmentation stage of the series of segmentation stages and the final segmentation stage of the series of segmentation stages;
each decision stage determines whether the received set of data as currently processed can be pushed for distribution or whether additional segmentation is required;
upon a determination of pushing for distribution the step of distributing is performed otherwise the next segmentation stage of the series of segmentation stages is executed; and
the final segmentation stage is a time based segmentation.

20. The computer-readable medium according to claim 11, wherein a lead source of the plurality of lead sources is a website of social media platform comprising a plurality of webpages; and
the first rules of the plurality of first rules and the second rule of the plurality of second rules are established in dependence upon a webpage of the plurality of webpages from which the received set of data was generated.

* * * * *